(12) United States Patent
Steenwyk et al.

(10) Patent No.: US 7,733,332 B2
(45) Date of Patent: Jun. 8, 2010

(54) KEYLESS ENTRY TOUCH PAD SYSTEM AND METHOD

(75) Inventors: Timothy E. Steenwyk, Hudsonville, MI (US); David A. Dzioba, Frankenmuth, MI (US); Michael J. Taylor, Longmont, CO (US)

(73) Assignee: TouchSensor Technologies, LLC, Wheaton, IL (US)

( * ) Notice: Subject to any disclaimer, the term of this patent is extended or adjusted under 35 U.S.C. 154(b) by 1062 days.

(21) Appl. No.: 11/315,820

(22) Filed: Dec. 22, 2005

(65) Prior Publication Data
US 2006/0238385 A1 Oct. 26, 2006

Related U.S. Application Data

(60) Provisional application No. 60/638,159, filed on Dec. 23, 2004, provisional application No. 60/638,197, filed on Dec. 23, 2004, provisional application No. 60/638,198, filed on Dec. 23, 2004.

(51) Int. Cl.
*G09G 5/00* (2006.01)
(52) U.S. Cl. ...................................... 345/173
(58) Field of Classification Search .................. 345/173; 341/22, 33; 340/5.51, 5.54, 5.72
See application file for complete search history.

(56) References Cited

U.S. PATENT DOCUMENTS

| | | | |
|---|---|---|---|
| 4,125,783 A | 11/1978 | Sefton | |
| 4,290,052 A | 9/1981 | Eichelberger et al. | |
| 4,290,061 A * | 9/1981 | Serrano | 345/174 |
| 4,380,040 A | 4/1983 | Posset et al. | |
| 5,467,080 A | 11/1995 | Stoll et al. | |
| 5,594,222 A * | 1/1997 | Caldwell | 200/600 |
| 6,452,514 B1 * | 9/2002 | Philipp | 341/33 |
| 6,617,975 B1 | 9/2003 | Burgess | |
| 6,822,640 B2 * | 11/2004 | Derocher | 345/173 |
| 6,958,459 B2 * | 10/2005 | Engelmann | 200/600 |
| 7,361,860 B2 * | 4/2008 | Caldwell | 200/600 |
| 2004/0124714 A1 | 7/2004 | Caldwell | |

FOREIGN PATENT DOCUMENTS

| | | |
|---|---|---|
| EP | 1487105 | 12/2004 |
| FR | 2779889 | 12/1999 |
| GB | 2156992 | 10/1985 |

OTHER PUBLICATIONS

PCT Search Report Dated Sep. 6, 2006.
PCT Search Report Dated May 15, 2006.

* cited by examiner

*Primary Examiner*—Richard Hjerpe
*Assistant Examiner*—Tom V Sheng
(74) *Attorney, Agent, or Firm*—Barnes & Thornburg LLP

(57) ABSTRACT

A keyless entry touch pad system for a vehicle includes a substrate with a plurality of touch zones disposed on one surface of the substrate, and a plurality of electrode patterns disposed on the opposite surface. An inner electrode of each pattern is aligned with one of the touch zones. Each pattern is electrically coupled to an integrated control circuit, which outputs a signal to and energizes the electrodes of the pattern such that electric fields emanates therefrom. The electrode patterns may be capacitively coupled to the integrated control circuit. When the electric field of the inner electrode is disturbed by a stimulus proximate the corresponding touch zone, the component is activated. Upon activation of the components in a predetermined sequence, a controller causes the vehicle door to unlock. A method of unlocking a vehicle is also disclosed.

11 Claims, 5 Drawing Sheets

KEYLESS ENTRY TOUCH PAD SYSTEM AND METHOD

CROSS REFERENCE TO RELATED APPLICATIONS

This application claims priority from and incorporates by reference the disclosure of U.S. Provisional Patent Application No. 60/638,159, filed on Dec. 23, 2004. This application also claims priority from and incorporates by reference the disclosures of U.S. Provisional Patent Application No. 60/638,197, filed on Dec. 23, 2004, and U.S. patent application Ser. No. 11/315,719, filed Dec. 22, 2005, both entitled Track Position Sensor and Method, and U.S. Provisional Patent Application No. 60/638,198, filed on Dec. 23, 2004, and U.S. patent application Ser. No. 11/315,717, filed Dec. 22, 2005, both entitled Seat Control System.

FIELD OF THE INVENTION

The present invention relates generally to keyless access touch pad systems and, more particularly, to a keyless entry touch pad system for a vehicle.

BACKGROUND OF THE INVENTION

Keyless entry systems for vehicles allow users to lock or unlock the doors or trunk of a vehicle without a key. Remote keyless entry systems typically include a pocket-sized fob that includes several pushbuttons that unlock doors or the trunk and perform other functions through encoded RF signals transmitted to a vehicle-installed receiver. Door-mounted keyless entry systems typically include a keypad positioned near the door handle, enabling an authorized user of the vehicle to input a numeric code and thereby gain entry to the vehicle. Such keypads can be used to control other functions, as well.

Some conventional keypads include an array of mechanical switches that are mounted on the keypad and hard-wired to a control module. The keypad typically is fixed to the door panel. As such, the door panel typically includes an opening for receiving the keypad. This opening, if not adequately protected, may permit the surrounding metal panel to corrode and damage the exterior finish. In addition, the keypad itself includes openings for receiving the switches. These openings allow dirt, water and other contaminants to pass into and become trapped within the switch, potentially leading to electrical shorts and other malfunctions.

Other keyless systems use electronic or capacitive solid state switches. Unlike mechanical switches, electronic switches contain no moving parts to break or wear out. However, electronic switches may malfunction when contaminants such as water and debris are present on the touch surface. The contaminants may cause unintended switch actuations. Given that the exterior surface of a vehicle is exposed to a tremendous amount of water, dirt, road spray, and other contaminants, electronic switches have not proven reliable for keyless entry systems. Furthermore, many electronic switches respond to environments with electromagnetic interference (EMI) in unpredictable ways, and may not conform to increasingly rigid electromagnetic compatibility (EMC) standards.

SUMMARY OF THE INVENTION

The present invention is directed to a keyless access touch pad system. The system preferably includes a dielectric substrate having first and second opposite surfaces. Preferably, a plurality of touch zones is defined on the first surface and a plurality of electrode patterns is disposed on the second surface. Each electrode pattern is aligned with a corresponding one of the touch zones. Each electrode pattern preferably includes a first electrode in proximity to a second electrode. More preferably, each electrode pattern includes an inner electrode pad and an outer electrode substantially surrounding the inner electrode. A pulse generation circuit is electrically coupled to and provides an excitation signal to the electrodes of each electrode pattern 18. The excitation signal induces electric fields about the electrodes. The electric field about each electrode is disturbed when a stimulus, for example, human touch, is introduced proximate the corresponding touch zone. The electrodes preferably are coupled to a detection circuit that detects and responds to the disturbance to the electric fields about each electrode. Each detection circuit preferably is coupled to a controller that provides signals to a controlled device in response to signals received from the plurality of detection circuits. Preferably, the pulse generation and detection circuits are disposed on a single integrated circuit chip that is located on the substrate proximate the electrode patterns. Preferably, the substrate is free of penetrations, at least in areas proximate the electrodes and related circuitry and the touch zones, to reduce the potential for contaminants to migrate from the touch zones to the circuit-carrying side of the substrate. Light emitting devices may be included to provide visual feedback that a touch zone has been touched or to otherwise illuminate the keypad.

The present invention is also directed to a capacitively coupled electrode pattern field effect touch sensor apparatus. The apparatus preferably includes a dielectric substrate having first and second opposing surfaces. An electrode pattern preferably having an inner electrode and an outer electrode is disposed on the first surface. Each of the inner and outer electrodes is electrically coupled to a corresponding capacitive plate, also disposed on the first surface. Pulse generation and detection circuits can be disposed on the second surface and are electrically coupled to one or more capacitive plates disposed on the second surface. The plates on the first surface are capacitively coupled to the plates on the second surface so that the pulse generation and detection circuits are electrically coupled to the electrodes. The detection circuits preferably are coupled to a controller. The pulse generation and detection circuits and controller operate as discussed above.

The present invention is further directed to a method of unlocking a door of an automobile using field effect touch sensor apparatus.

DETAILED DESCRIPTION OF THE ILLUSTRATED EMBODIMENTS

Figure 1:
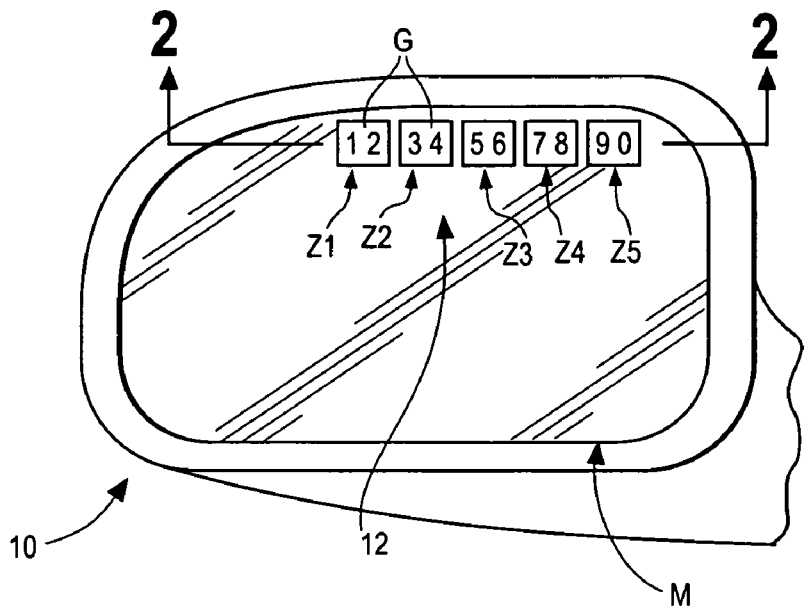
FIG. 1 is a front elevation view of a keyless entry touch pad system disposed on a side view mirror of a vehicle according to an embodiment of the present invention.

FIG. 1 illustrates a keyless entry touch pad system 10 for a vehicle according to a first embodiment of the present invention. System 10 includes a virtual keypad 12 having five touch zones Z1-Z5 displayed on side view mirror M. In other embodiments, more or fewer than five touch zones may be provided, and they may be associated with any other exterior surface of the vehicle, for example, the A-pillar or B-pillar, movable or fixed glass areas, door trim, and trunk/hatch trim.

Figure 2:
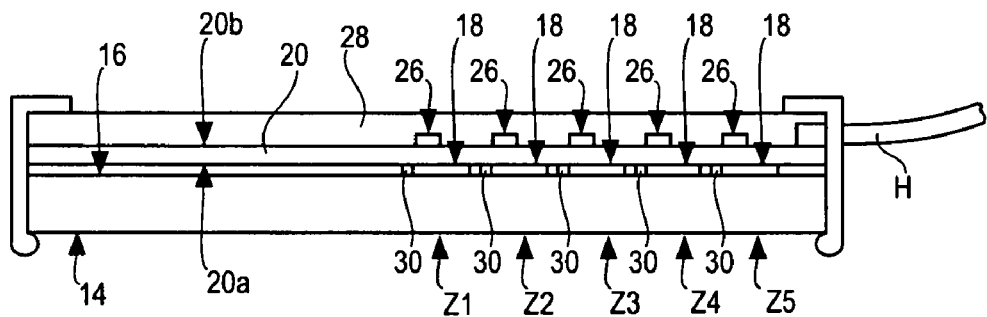
FIG. 2 is a cross sectional view of the system of FIG. 1 taken along line 2-2.

As best shown in FIG. 2, the reflective glass of mirror M includes an exterior surface 14 and an interior surface 16. Interior surface 16 typically has a reflective coating. A plurality of electrode patterns 18 is disposed adjacent interior surface 16. Electrode patterns 18 can be disposed on a substrate 20 such as a printed circuit board, flexible circuit carrier, or the like, which in turn may be adhered to interior surface 16 or positioned against interior surface 16 and subsequently locked into place with clips or the like. Alternatively, electrode patterns 18 can be applied directly to interior surface 16 or to a reflective coating or other thin layer thereon. In embodiments where such reflective coating is conductive, an insulating layer should be provided between the reflective coating and electrode patterns 18. Also, as would be understood by one skilled in the art, the presence of a continuous conductive layer between touch zones Z1-Z5 and corresponding electrode patterns 18 would adversely affect the generation of electric fields proximate touch zones Z1-Z5 and the operation of a field effect sensor as discussed below. As such, it is preferable to not include a conductive layer between touch zones Z1-Z5 and electrode patterns 18, or to include deletion lines in any such conductive coating to isolate the portion of the coating corresponding to the electrodes comprising each electrode pattern 18, as would be understood by one skilled in the art.

Figure 3:
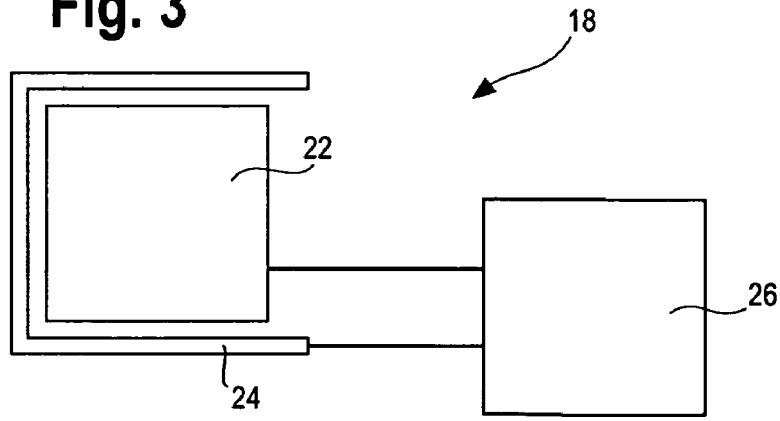
FIG. 3 is a schematic diagram of an electrode pattern according to the present invention.
Figure 4:
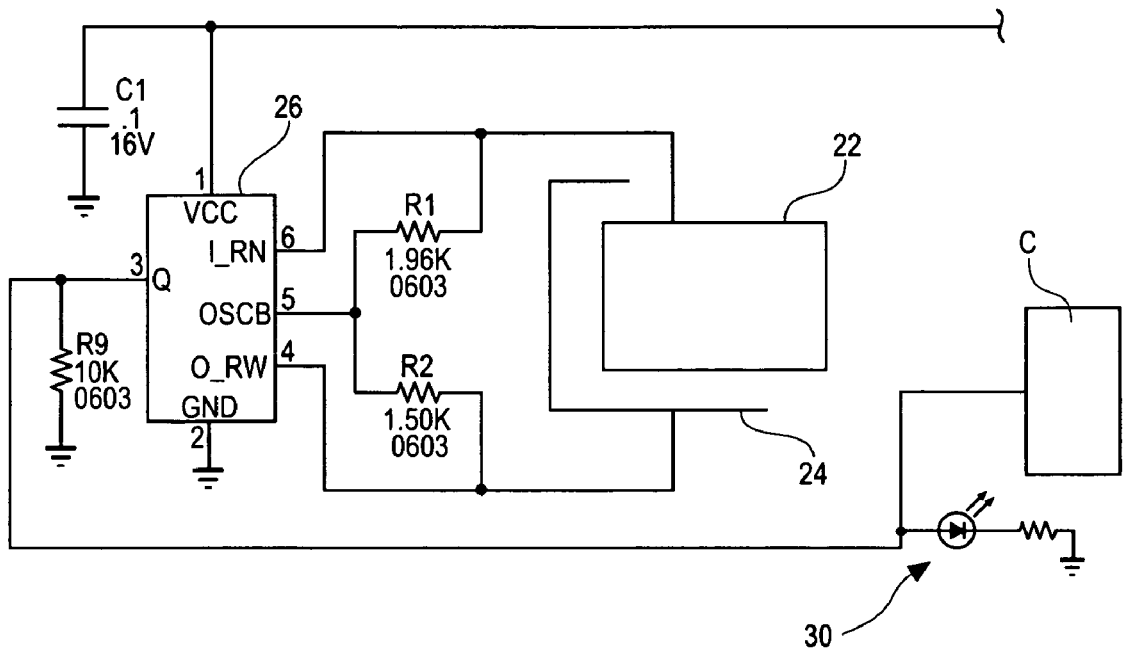
FIG. 4 is a schematic diagram of a preferred embodiment of the present invention.

As best shown in FIG. 3, each electrode pattern 18 preferably includes an inner electrode 22 and an outer electrode 24 substantially surrounding inner electrode 22. Inner and outer electrodes 22, 24 of each pattern 18 are electrically coupled to a pulse generation circuit and a detection circuit. Preferably, the pulse generation and detection circuits are embodied on a single integrated circuit 26, as shown in FIGS. 2 and 3. Preferably, integrated circuit 26 is disposed on substrate 20 proximate the corresponding electrode pattern 18, either on the same side 20a of substrate 20 as electrodes 22, 24 or on the opposite side 20b of substrate 20. As best shown in FIG. 4, integrated circuit 26 preferably is connected to inner and outer electrodes 22, 24 through resistors R1, R2, respectively. In certain embodiments, resistors R1, R2 can be provided internally within integrated circuit 26. In the illustrated embodiments, resistors R1, R2 are external to integrated circuit 26.

Integrated circuit 26 preferably is a TS-100 ASIC, available from TouchSensor Technologies, LLC of Wheaton, Ill. The general principles of operation of the TS-100 ASIC are described in U.S. Pat. No. 6,320,282 to Caldwell, the disclosure of which is incorporated herein by reference. The pin-out of integrated circuit 26 as shown in the drawings corresponds to that of the TS-100 ASIC, where the input power (+5 volts) connection is on pin 1, the ground connection is on pin 2, the signal output connection is on pin 3, the outer electrode 24 connection is on pin 4, the excitation signal connection is on pin 5, and the inner electrode 22 connection is on pin 6.

Wiring associated with the input power and signal output connections from integrated circuits 26 may be bundled together in a harness H, as best shown in FIG. 2. Preferably, a quick set potting material 28 overlays and seals substrate 20 and the end of harness H.

Electrical signals are provided to inner and outer electrodes 22, 24 via the excitation signal from pin 5, as best shown in FIG. 4. Preferably, an oscillator output pulse train or square wave signal is provided at pin 5 to both inner electrode 22 and outer electrode 24. The oscillator signal may be a square wave oscillating between 0 and +5 volts at a frequency of approximately 32 kHz. Alternatively, the oscillator or strobe signal may have a frequency of up to or greater than 200 kHz, depending on the detection circuitry used. Furthermore, the strobe signal may oscillate between 0 and +3 volts, 0 and +12 volts, 0 and +24 volts, −5 volts and +5 volts, or any other voltage range.

The applied electrical signals energize inner and outer electrodes 22, 24, generating an electric field about each of electrodes 22, 24. Electric flux lines emanate from inner and outer electrodes 22, 24 and through mirror M, as best shown by dashed lines in FIG. 5. A plurality of touch zones Z1, Z2, Z3, Z4 and Z5 is provided on exterior surface 14 of mirror M, as best shown in FIGS. 1 and 2. Each touch zone Z1-Z5 preferably is coaxially aligned with a corresponding inner electrode 22 from each of patterns 18. As such, an electric field corresponding to each of inner and outer electrodes 22, 24 emanates from each of touch zones Z1-Z5. For example, FIG. 5 illustrates the electric fields emanating from the electrodes aligned with touch zone Z1.

Figure 5:
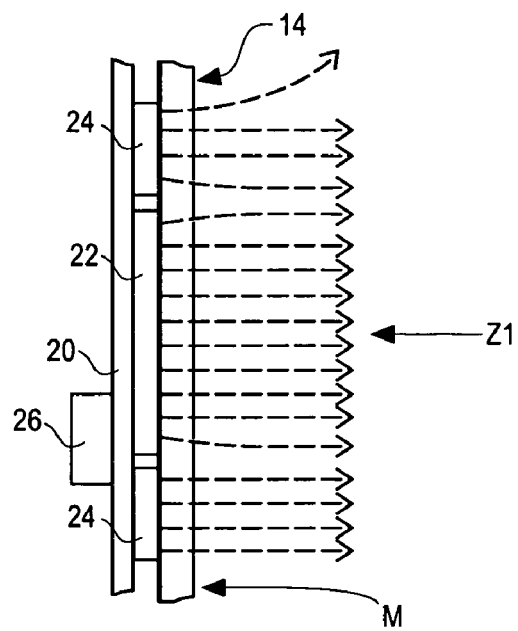
FIG. 5 is a fragmentary cross sectional view of a portion of system shown in FIG. 2 with dashed lines representing electric flux lines.

Although not shown in FIG. 5, electric flux lines also emanate from inner and outer electrodes 22, 24 through substrate 20 away from mirror M, rather than through mirror M and into touch zones Z1-Z5. However, the electric flux concentration would be greater near exterior surface 14 of mirror M given that the electric flux concentration is multiplied through dielectric substrates such as mirror M, as would be understood by one skilled in the art. In order to shield or dissipate such electric fields emanating in a direction away from mirror M so that the detection circuit does not respond to stimuli proximate such electric fields, system 10 preferably includes an insulator, such as potting material 28, adjacent side 20b of substrate 20. An air gap, a backing of foam rubber or plastic, or other electric field attenuator may be provided in lieu of potting material 28.

Inner and outer electrodes 22, 24 are charged such that all of the electric fields emanating therefrom have the same polarity. As such, the fields repel and extend outwardly from inner and outer electrodes 22, 24. Field strength is greatest closer to electrodes 22, 24, and dissipates with distance from electrodes 22, 24. Preferably, the strength of the electric fields is substantially dissipated at a distance of about 25 mm from exterior surface 14 of mirror M. The excitation signal strength may be increased or decreased if stronger or weaker fields, respectively, are desired.

Resistors R1, R2 are selected such that a predetermined potential difference or voltage is created by each electric field. The strengths of the electric fields generated about inner and outer electrodes 22, 24 are sensed and compared within the corresponding detection circuit. In this way, the detection circuit monitors the strengths of the electric fields about the corresponding inner and outer electrodes 22, 24. When an object or stimulus, such as a human finger, is proximate the corresponding touch zone, the electric fields associated with inner and outer electrodes 22, 24 are altered. Preferably, the stimulus must be 25 mm or closer to one of touch zones Z1-Z5 to disrupt the electric field associated with the corresponding electrodes, given the field strength is substantially dissipated at further distances. The detection circuit generates an output signal indicating a touch input at a particular touch zone when the difference in strength between the electric fields about inner electrode 22 and outer electrode 24 corresponding to such touch zone exceeds a predetermined threshold.

A further discussion of the principles of operation of preferred field effect sensors can be found in, for example, U.S. Pat. No. 6,320,282 to Caldwell, the disclosure of which is incorporated herein by reference.

A sheet of printed graphics G which identifies touch zones Z1-Z5 may be adhered to interior surface 16 of mirror M such that graphics G are visible from surface 14, as best shown in FIG. 1. Alternatively, graphics G may be etched, printed, or otherwise disposed directly onto interior surface 16 or exterior surface 14 of mirror M. Printing graphics G on exterior surface 14 is not preferred, however, given that exposed printed graphics may be scratched off or otherwise wear off. In any event, graphics G preferably are aligned with touch zones Z1-Z5 and inner electrodes 22. Graphics G for each touch zone Z1-Z5 may include numbers, letters, or some other indicator distinguishing each touch zone Z1-Z5. Preferably, touch zones Z1-Z5 are linearly disposed across an upper edge of mirror M.

Preferably, system 10 also includes one or more light-emitting diodes 30, wherein each light-emitting diode (LED) 30 is electrically coupled to a corresponding integrated circuit 26, as best shown in FIG. 4. When integrated circuit 26 produces an output signal to controller C, described further below, the associated LED 30 is illuminated. In a preferred embodiment, an LED 30 is associated with each integrated circuit 26, and positioned on substrate 20 so that each LED 30 is aligned with a corresponding touch zone Z1-Z5, as best shown in FIG. 2. All LEDs 30 preferably are electrically coupled to each integrated circuit 26 so that all LEDs are triggered upon activation of any of integrated circuits 26. In this way, virtual keypad 12 lights up and is visible to the user upon any of integrated circuits 26 outputting a signal to controller C.

Controller C, for example, a microprocessor, is in communication with the pulse generation and detection circuits associated with each electrode pattern 18, and may be disposed either on substrate 20 or remote from substrate 20. Controller C receives detection signals from the detection circuit associated with each electrode pattern 18. These detection circuits are distinguishable from each other so that controller C can interpret which sensor has been activated and/or in which sequence plural sensors have been activated. In response, controller C generates a control signal and outputs the control signal to a controlled device. In a preferred embodiment, controller C is in communication with a lock mechanism in one or more of a vehicle's doors. When touch zones Z1-Z5 are disturbed in a predetermined sequence, such that the detection circuits corresponding to these touch zones output detection signals to controller C in such sequence, controller C generates a control signal causing actuation of the lock mechanism, thereby locking or unlocking one or more doors.

Figure 6:
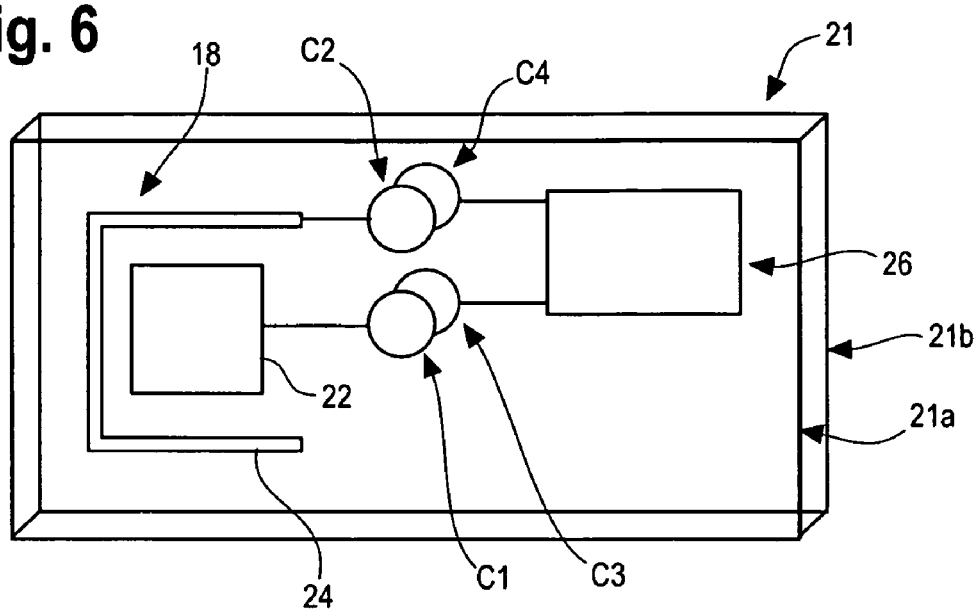
FIG. 6 is a perspective view of a capacitively coupled field effect electrode pattern according to another embodiment of the present invention.
Figure 7:
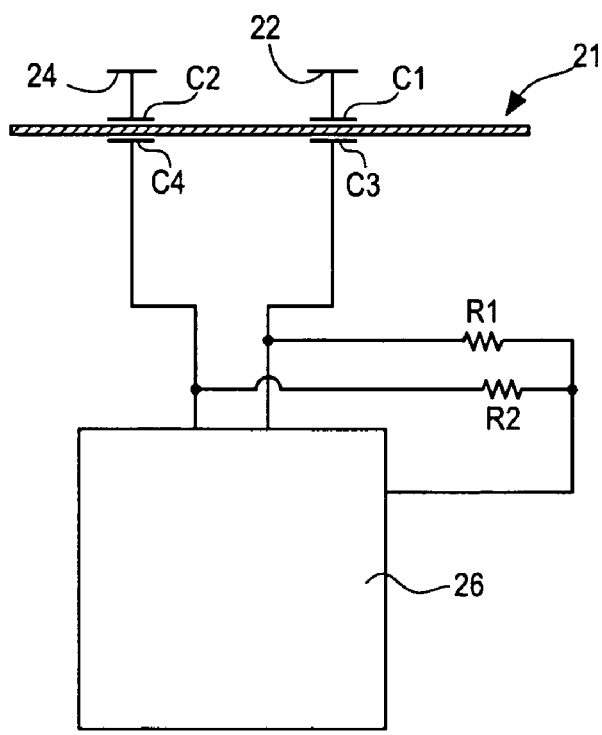
FIG. 7 is a schematic diagram of the embodiment shown in FIG. 6.

The pulse generation and detection circuits may be hardwired to electrodes 22, 24 via conductors such as lead wires or PCB traces. Alternatively, another aspect of the present invention provides that the pulse generation and detection circuits can be capacitively coupled to electrodes 22, 24, as best shown in FIGS. 6 and 7. Electrodes 22, 24 of pattern 18 are disposed on side 21a of a dielectric substrate 21. For example, substrate 21 may be formed from glass, plastic, fiberglass reinforced epoxy resin, or some other dielectric material. Electrodes 22, 24 are electrically coupled to capacitive plates C1, C2, respectively, which are also disposed on one side 21a of substrate 21. Component 26 is disposed on the opposing side 21b of substrate 21, and is electrically coupled to capacitive plates C3, C4, also disposed on side 21b. Plates C1, C2 are aligned with plates C3, C4, respectively, such that plates C1 and C3 are capacitively coupled, and plates C2 and C4 are capacitively coupled. As a result, component 26 is capacitively coupled to electrodes 22, 24.

While capacitive coupling is described with reference to system 10, this aspect of the present invention may be applicable for other applications, such as for sensor pads used in commercial appliances. Electrodes 22, 24 may be capacitively coupled through a relatively thick dielectric substrate, which would not otherwise allow an electric field of sufficient strength to emanate therethrough. Electrodes 22, 24 may be located on one side of substrate, and the sense electronics located on the other side of the substrate. This allows for a sealed dielectric substrate, while still allowing the electrodes 22, 24 to be located closer to the object to be sensed.

Figure 8:
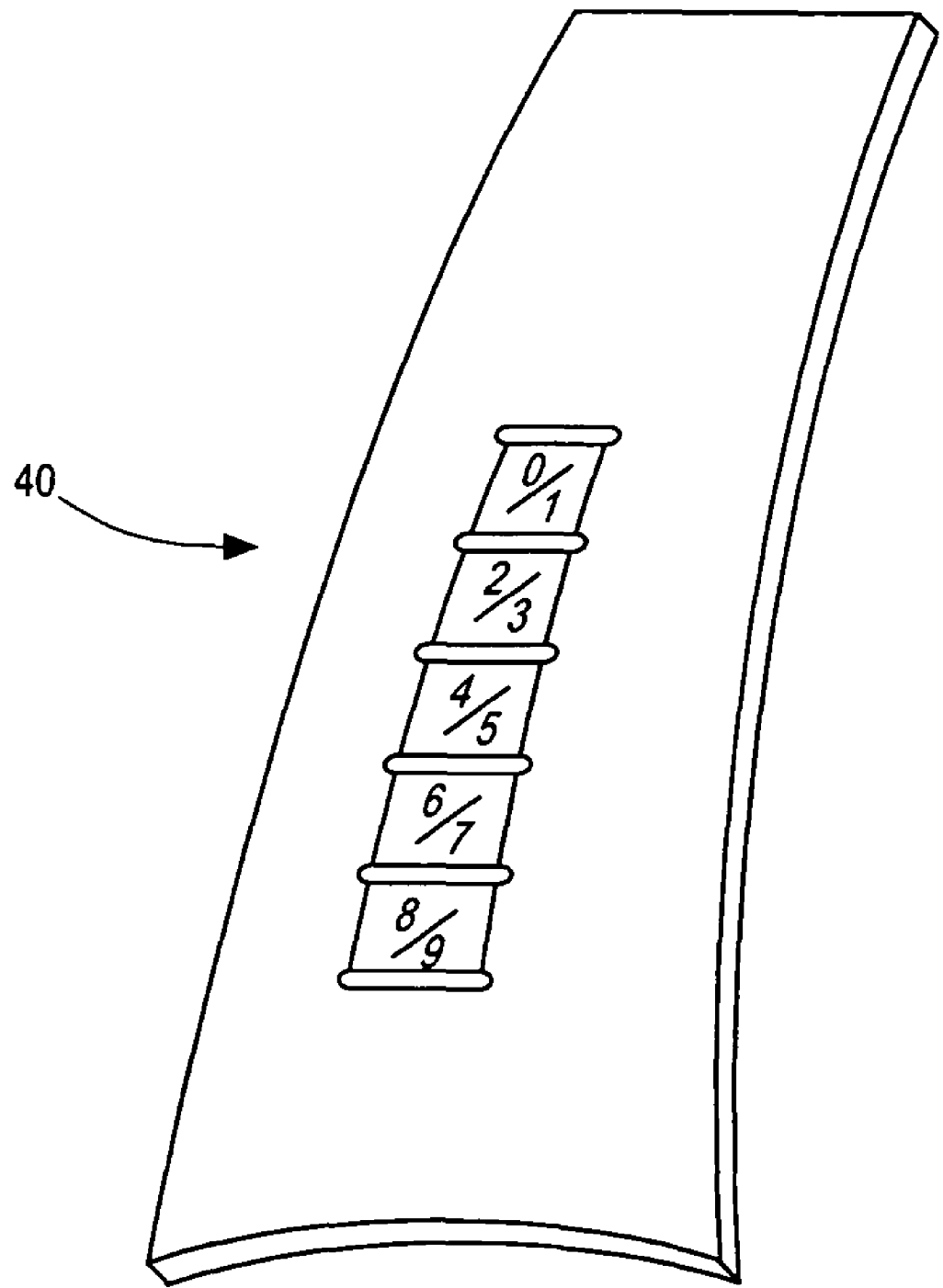
FIG. 8 is a perspective view of a keyless entry touch pad system disposed on a pillar of a vehicle according to an embodiment of the present invention.

While system 10 has been described with reference to side view mirror M, keypad 12 may be disposed on other surfaces of the vehicle, such as the A or B pillar of the vehicle, the door handle, or a trim piece. Such surface may include a translucent portion for displaying virtual keypad 12. For example, a molded fiberglass B pillar 40 may be provided with virtual keypad 12 disposed thereon, which lights up upon activation of one or more LEDs associated with the components, as best shown in FIG. 8. Alternatively, the surface may include molded depressions or protrusions, which define the touch zones.

Figure 9:
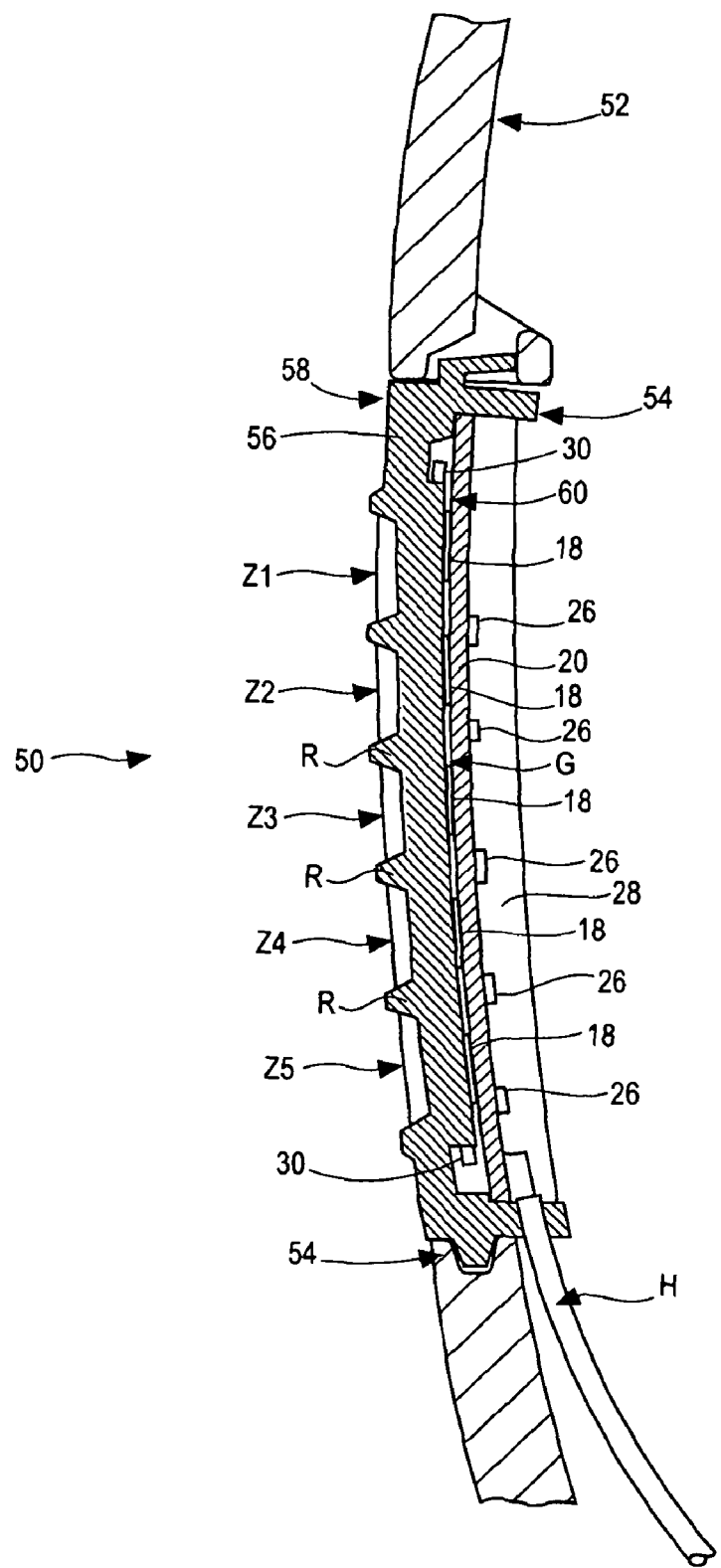
FIG. 9 is a fragmentary cross sectional view of a keyless entry touch pad system according to an embodiment of the present invention.

Alternatively, a keyless entry touch pad system may be provided on a separate substrate, which is secured to an exterior surface of the vehicle. As best shown in FIG. 9, a keyless entry pad system 50 is secured to an opening provided within an exterior surface 52 of the vehicle, such as a plastic or metal trim piece, the vehicle's door handle, or the A or B pillar of the vehicle. Surface 52 may include lock tabs 54, so that system 50 may be easily snapped or clamped in place during manufacture.

System 50 includes an outer panel 56 formed from a dielectric material, such as glass, plastic or fiberglass reinforced epoxy resin. Preferably, panel 56 is translucent. Similar to system 10, panel 56 includes a plurality of touch zones Z1-Z5 on an exterior surface 58 forming a keypad. Further, a plurality of electrode patterns 18 are disposed adjacent an interior surface 60 of panel 56. Patterns 18 may be provided on substrate 20, which is adhered or positioned against interior surface 60, as described above. Each pattern 18 includes inner and outer electrodes 22, 24, which are electrically coupled to an active electrical component 26, as described above. Integrated control circuits 26 of system 50 may either be hardwired to electrodes 22, 24, or capacitively coupled thereto. Each of integrated control circuits 26 is preferably a TS-100 ASIC, having the same pin-out as described above. Wiring associated with input power connections and signal output connections from integrated control circuits 26 may be bundled together in harness H, or an integral connector may be provided. A quick set potting material 28 or other insulator preferably overlays and seals substrate 20 and the end of harness H. Alternatively, an air gap or insulating backing may be provided.

As described above, touch zones Z1-Z5 are aligned with corresponding inner electrodes 22 such that electric fields emanate therefrom, as best shown in FIG. 5. When an object or stimulus, such as a human finger, is proximate the corresponding touch zone, the electric field associated with inner electrode 22 is altered. Integrated control circuit 26 is activated if a difference in field strength between inner electrode 22 and outer electrode 24 exceeds a predetermined threshold. Upon activation, component 26 generates a command signal, which is sent to an associated controller, such as a microprocessor.

A sheet of printed graphics G may be provided on either interior surface 60 or exterior surface 58 of panel 56. Alternatively, or in addition to graphics G, exterior surface 58 of panel 56 may include molded portions, such as depressions or ridges R, defining each touch zone Z1-Z5, as best shown in FIG. 9. Graphics G may either be printed directly onto panel 56, or provided on a sheet that is adhered to a surface of panel 56. Touch zones Z1-Z5 may be linearly disposed along a portion of surface 52, or arranged in some other pattern. System 50 may include one or more light-emitting diodes 30 as discussed above in connection with system 10.

The embodiments disclosed herein are exemplary only, and should not be construed to limit the invention. For example, the present invention could be used to control locks in doors of buildings, rather than vehicles, or to control operation of equipment other than locks. Further, the present invention may be used for various other applications, such as lighting, waking of electronics from sleep mode, etc. Also, aspects of one embodiment may be incorporated into another embodiment. Thus, this disclosure may be modified without departing from the scope of the present invention, which is defined in the following claims.

We claim:

1. A keyless entry pad system for unlocking a door of an automobile, comprising:
   a dielectric substrate having first and second opposite surfaces;
   a plurality of touch zones disposed on said first surface;
   a printed circuit board having first and second sides, said first side adjacent said second surface;
   a plurality of electrode patterns disposed on said first side, each of said electrode patterns having an inner electrode and an outer electrode, each of said inner electrodes aligned with one of said touch zones, said electrodes electrically coupled to capacitive plates disposed on said first side;
   a plurality of integrated control circuits (ICCs) disposed on said second side, each of said ICCs electrically coupled to capacitive plates disposed on said second side, wherein said plates on said first side are capacitively coupled to said plates on said second side so that said ICCs are electrically coupled to said patterns, each of said ICCs energizing the electrodes of a corresponding pattern such that electric fields emanate from the electrodes, wherein the electric field of the associated inner electrode is disturbed when a stimulus is proximate the corresponding touch zone, thereby causing the corresponding ICC to output a signal indicative of a touch to said touch zone; and
   a controller in communication with said ICC, said controller causing the unlocking of said door upon receipt of predetermined signals from said ICCs in a predetermined sequence.

2. The keyless entry pad system of claim 1, wherein said substrate is translucent.

3. The keyless entry pad system of claim 2, further comprising a plurality of LEDs electrically coupled to said ICCs, said LEDs triggered when one of said ICCs outputs a predetermined signal.

4. The keyless entry pad system of claim 3, wherein said LEDs are proximate said substrate so that said substrate is illuminated by said LEDs.

5. The keyless entry pad system of claim 1, wherein said substrate comprises a portion of said automobile.

6. The keyless entry pad system of claim 5, wherein said substrate is one of a rear view mirror, a trim piece, or a pillar.

7. The keyless entry pad system of claim 1, further comprising printed graphics on said second surface, said graphics aligned with said touch zones and visible from said first surface.

8. The keyless entry pad system of claim 1, wherein said printed circuit board is flexible.

9. A capacitively coupled electrode pattern field effect touch sensor apparatus, comprising:
   a dielectric substrate having first and second opposite surfaces;
   an electrode pattern having an inner electrode and an outer electrode disposed on said first surface, each of said inner and outer electrodes electrically coupled to capacitive plates disposed on said first surface;
   an integrated control circuit (ICC) disposed on said second surface, said ICC electrically coupled to capacitive plates disposed on said second surface, wherein said plates on said first surface are capacitively coupled to said plates on said second surface so that said ICC is electrically coupled to said electrodes, said ICC energizes said electrodes such that an electric field emanates from each said electrodes, and said ICC senses disturbances in the electric fields; and
   a controller in communication with said ICC, wherein said ICC transmits signals to said controller in response to a disturbed electric field.

10. The touch sensor apparatus of claim 9, wherein said ICC applies a strobe signal to each of said electrodes for energizing said electrodes.

11. The touch sensor apparatus of claim 9, wherein said substrate is flexible.

* * * * *